United States Patent [19]
Yang et al.

[11] Patent Number: 5,424,971
[45] Date of Patent: * Jun. 13, 1995

[54] UNSIGNED CONSTANT MULTIPLIER COMPILER

[75] Inventors: Lin Yang, Fremont; Chun-Ling Liu, Milpitas, both of Calif.

[73] Assignee: VLSI Technology, Inc., San Jose, Calif.

[*] Notice: The portion of the term of this patent subsequent to May 17, 2011 has been disclaimed.

[21] Appl. No.: 983,077

[22] Filed: Nov. 12, 1992

[51] Int. Cl.⁶ .............................................. G06F 7/52
[52] U.S. Cl. .................................................. 364/757
[58] Field of Search ................. 364/754, 757, 758, 760

[56] References Cited

U.S. PATENT DOCUMENTS 4,679,164  7/1987  Rearick ............................... 364/754
5,121,352  6/1992  Hesson ............................... 364/757

*Primary Examiner*—Tan V. Mai
*Attorney, Agent, or Firm*—Burns, Doane, Swecker & Mathis

[57] ABSTRACT

A constant multiplier compiler model allows a constant multiplier circuit design to be generated from a user specification of the desired constant. A netlist of a constant multiplier circuit for computing a product of a multi-bit multiplicand and a multi-bit constant is automatically generated by modifying a netlist of a precursor constant multiplier circuit for computing a product of the multi-bit multiplicand and a multi-bit constant that is all ones. For each zero in the multi-bit constant, a corresponding logical column of full adders is deleted and each output signal of each adder so deleted is logically connected to a corresponding output signal in a preceding logical column of adders. Two exceptions to the foregoing rule occur. In the case of a first logical column of adders having no preceding logical column of adders, each output signal of each adder deleted is logically connected to a bit of the multi-bit multiplicand. In the case of a logical row of adders receiving a most significant bit of the multi-bit multiplicand, each output signal of each adder deleted is logically connected to one of the most significant bit of the multi-bit multiplicand and logic zero. The method produces a minimum layout, minimizing silicon cost, and produces a high performance design with critical paths optimized in terms of time delay.

1 Claim, 7 Drawing Sheets

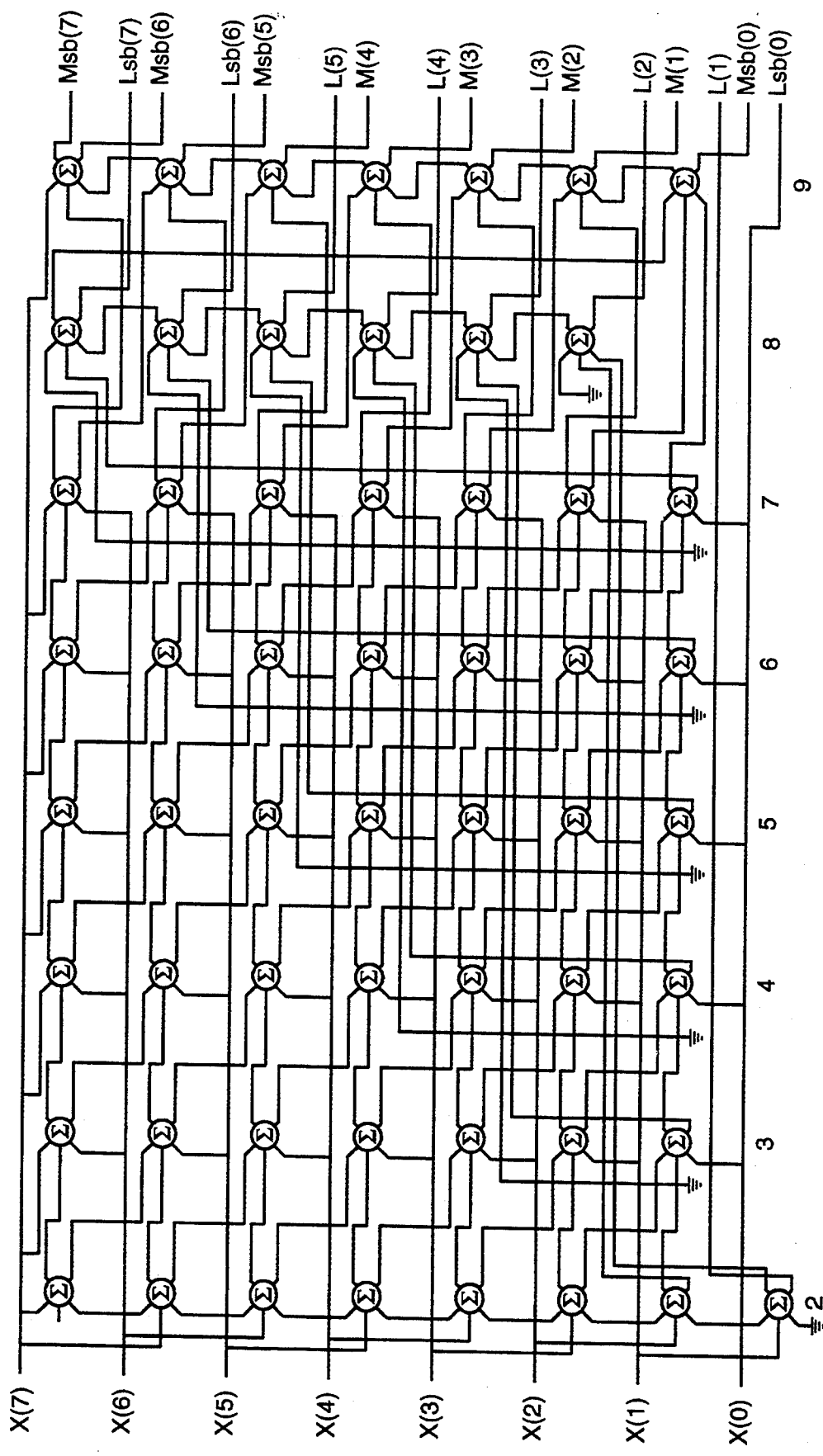
FIG._1

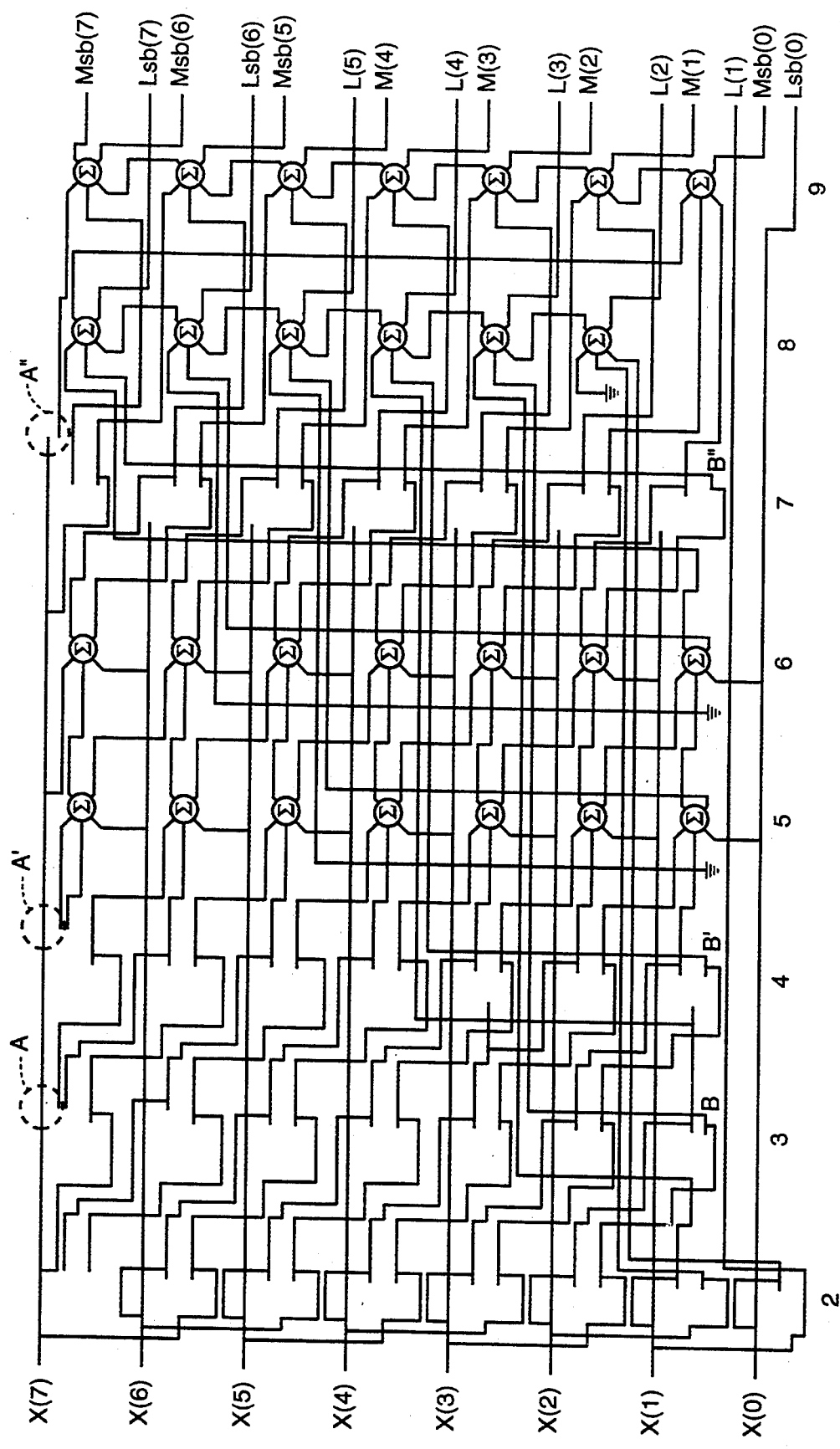
FIG._2

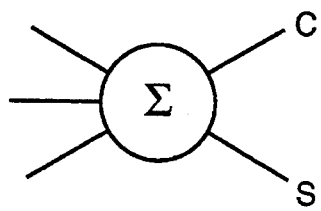
FIG._3
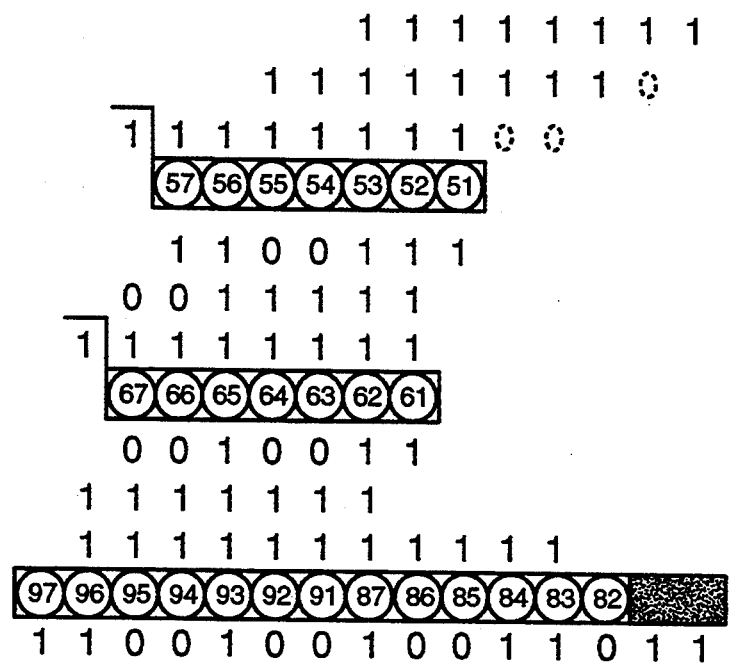
MULTIPLICAND = "11111111"
CONSTANT = "01100101"
FIG._6

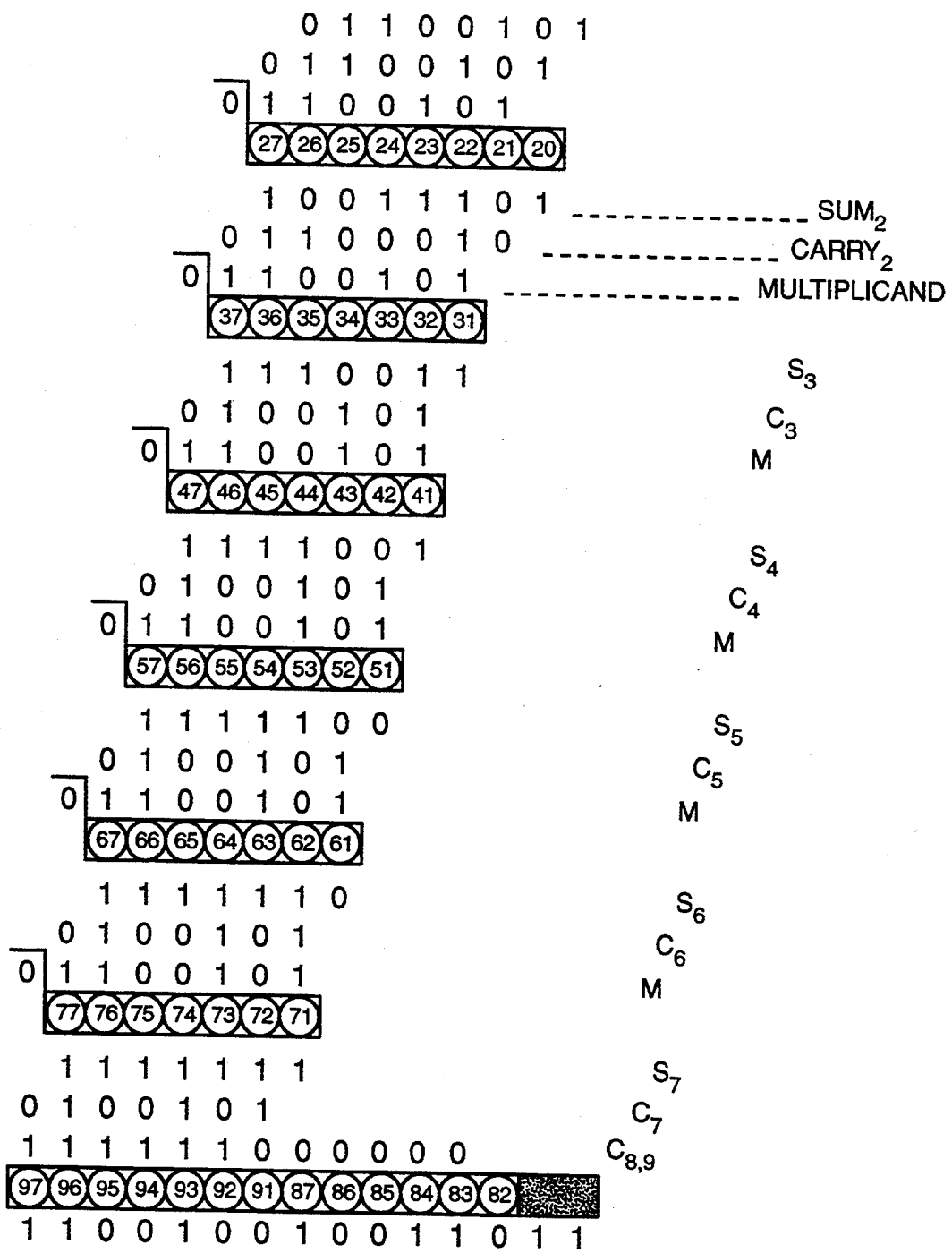
FIG._4

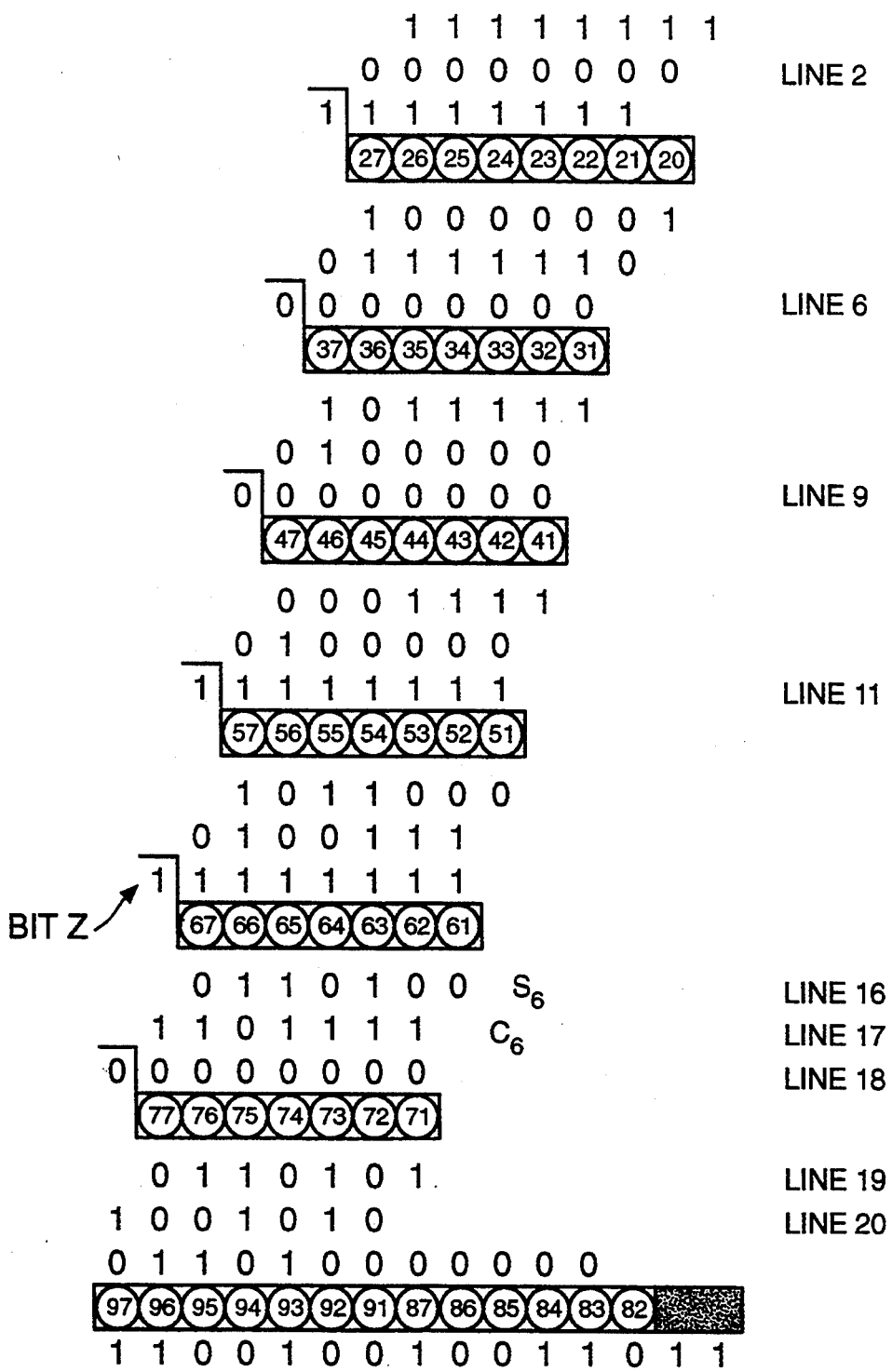
FIG._5

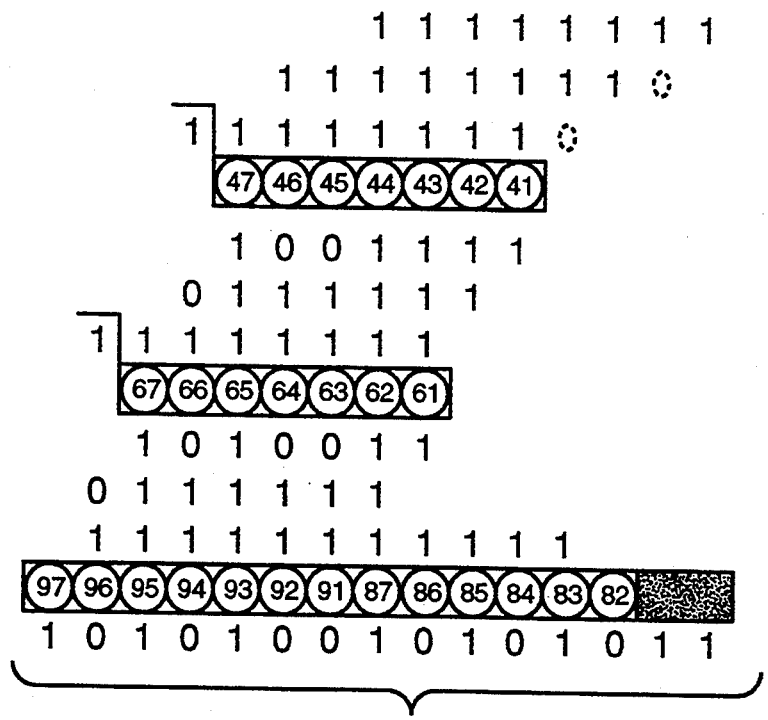
FIG._7
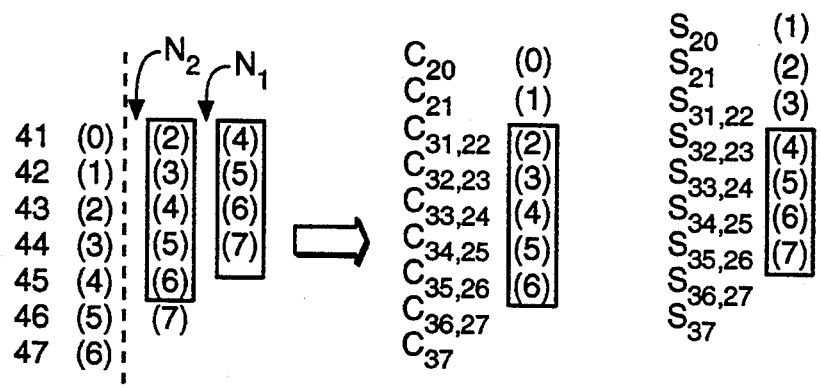
FIG._8

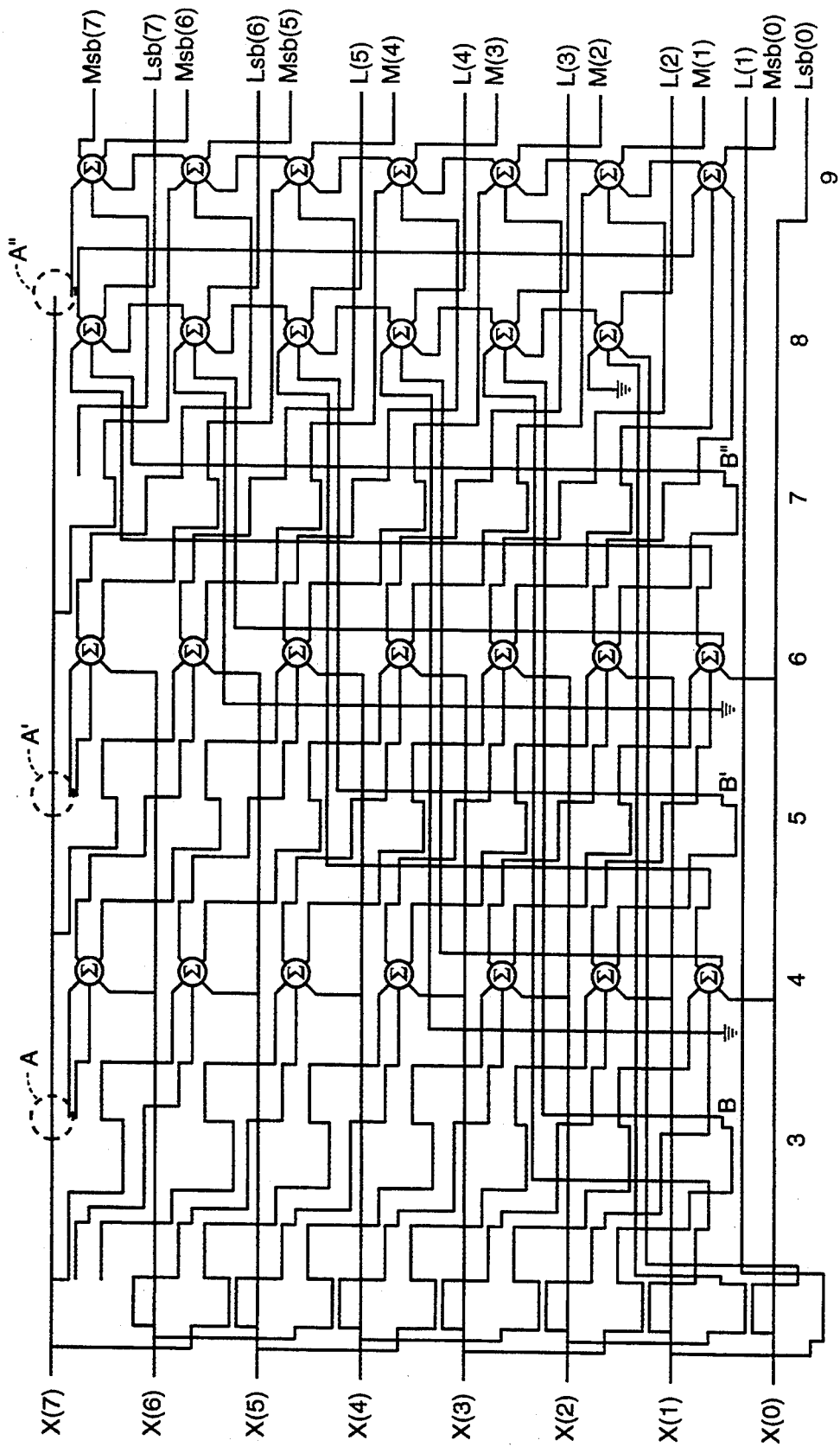
FIG._9

5,424,971

UNSIGNED CONSTANT MULTIPLIER COMPILER

BACKGROUND OF THE INVENTION

1. Field of the Invention

The present invention relates to computer-aided integrated circuit design tools. In particular, the invention relates to circuits and methods for use in a data path compiler, an integrated circuit design tool that translates a functional description of datapath elements into a hardware realization.

2. State of the Art

Datapath compilers are known in the art. These computer-aided integrated circuit design tools accept a functional user specification of desired datapath elements and from that specification generate a hardware circuit layout that realizes the desired function. The desired function may be a simple counting function. Often, however, the function is arithmetic. For example, the user may specify that a data word be added together with a predefined constant. The datapath element that performs this function may be referred to as a constant adder. Similarly, the user may specify that a data word be multiplied by a predefined constant. The datapath dement that performs this function may be referred to as a constant multiplier. As used herein, the term "constant multiplier" refers to a special-purpose multiplier that multiplies a data word by a fixed, unsigned constant. To accommodate variable word length and arbitrary constants, constant multipliers have typically required detailed design by a design engineer. That is, constant multipliers have not been readily compilable.

SUMMARY OF THE INVENTION

The present invention, generally speaking, provides a constant multiplier compiler model according to which a constant multiplier circuit design may be generated from a user specification of the desired constant. The model may be expressed both in terms of an apparatus and a method. In accordance with one embodiment of the invention, a constant multiplier circuit for computing a product of a multi-bit multiplicand and a multi-bit constant uses full adders each having three input terminals and two output terminals, a Sum output terminal and a Carry output terminal. An interconnected array of full adders is logically arranged in rows and columns, full adders in an input column each receiving different ones of the bits of the multi-bit multiplicand and full adders in each of two output columns each producing a product bit. Each column besides the output columns produce a partial product, and each full adder in each row in columns besides the output columns receives a same one of the bits of the multi-bit multiplicand. A number of columns is less than the number of bits in the multiplicand, the array of full adders being interconnected such that partial products corresponding to zeros in the multi-bit constant are not produced.

In another embodiment of the invention, a netlist of a constant multiplier circuit for computing a product of a multi-bit multiplicand and a multi-bit constant, is automatically generated by modifying a method of generating a netlist of a precursor constant multiplier circuit for computing a product of the multi-bit multiplicand and a multi-bit constant that is all ones. For each zero in the multi-bit constant, a corresponding logical column of full adders is deleted and each output signal of each adder so deleted is logically connected to a corresponding output signal in a preceding logical column of adders. Two exceptions to the foregoing rule occur. In the case of a first logical column of adders having no preceding logical column of adders, each output signal of each adder deleted is logically connected to a bit of the multi-bit multiplicand. In the case of a logical row of adders receiving a most significant bit of the multi-bit multiplicand, each output signal of each adder deleted is logically connected to one of the most significant bit of the multi-bit multiplicand and logic zero. The method produces a minimum layout, minimizing silicon cost, and produces a high performance design with critical paths optimized in terms of time delay.

BRIEF DESCRIPTION OF THE DRAWINGS

The present invention may be further understood from the following written description in conjunction with the appended drawings. In the drawings:

FIG. 1 is a schematic diagram of a precursor constant multiplier circuit in which the constant is "11111111";

FIG. 2 is a schematic diagram of a modified constant multiplier circuit in which the constant is "01100101";

FIG. 3 is the symbol of a generalized full adder;

FIGS. 4 and 5 are representations of the multiplication operation "11111111"×"01100101" as that multiplication might be performed using a circuit like that of FIG. 1;

FIG. 6 is a representation of the same multiplication operation as performed by the circuit of FIG. 2;

FIG. 7 is a representation of the multiplication operation "11111111"×"01010101";

FIG. 8 is a diagram representing how connections of the sum and carry outputs in column 2 of FIG. 9 may be determined; and FIG. 9 is a schematic diagram of a modified constant multiplier circuit in which the constant.is "01010101".

DETAILED DESCRIPTION OF THE PREFERRED EMBODIMENTS

Referring to FIG. 1, a constant multiplier that multiplies an 8-bit input word by "11111111", or $255_{10}$, may be realized as shown by an interconnected array of full adders logically arranged in rows and columns. The present constant multiplier compiler is concerned only with the logical arrangement, or interconnection, of the full adders and not with their actual physical layout. Given a netlist of a circuit, physical design may be accomplished using any of numerous commercially available design layout programs.

An 8-bit constant multiplier may be realized using $7 \times 8 = 56$ generalized full adders of the type shown in FIG. 3. The adder has three input terminals and two output terminals, a Sum terminal and Carry terminal. The adder produces the output signals (C=0, S=0) if the total number of logic ones input to the three input terminals is 0, (C=0, S=1) if the total number of logic ones input to the three input terminals is one, (C=1 S=0) if the total number of logic ones input to the three input terminals is two, and (C=1, S=1) if the total number of ones input to the three input terminals is three.

Referring again to FIG. 1, the full adders are arrayed in substantially a 7×8 array, except that a first column has eight rows instead of seven, and a next-to-last column has six rows instead of seven. For convenience, the columns are designated as column 2, column 3, . . . , column 9. Column 2 adds the contribution of the first three bits (bits 0-2) of the constant to the final product, column 3 adds the contribution of the third bit of the constant, column 4 adds the contribution of the fourth bit of the constant, and so on up to column 7. Columns 8 and 9 together perform a final summation and constitute output columns, each of the adders in these two columns producing a bit of the output word. A most significant byte and a least significant byte of the output word are interleaved as shown. The first column, column 2, receives as inputs the bits of the multiplicand, X(0)–X(7).

The rows of the adder array are designated 0–7. Row 0 is occupied only in the case of column 2.

The adders are interconnected in a manner specified in Table 1 below. For example, adder 36, the adder in column 3 and row 6, receives as its inputs bit 5 of the input word, the carry output of adder 26, and the sum output of adder 27.

TABLE 1

| ADDER | INPUTS | ADDER | INPUTS |
|---|---|---|---|
| 20 | (0) (1) | | |
| 21 | (0) (1) (2) | 61 | (0) C51 S52 |
| 22 | (1) (2) (3) | 62 | (1) C52 S53 |
| 23 | (2) (3) (4) | 63 | (2) C53 S54 |
| 24 | (3) (4) (5) | 64 | (3) C54 S55 |
| 25 | (4) (5) (6) | 65 | (4) CSS S56 |
| 26 | (5) (6) (7) | 66 | (5) C56 S57 |
| 27 | (6) (7) | 67 | (6) C57 C57 |
| 31 | (0) C21 S22 | 71 | (0) C61 S62 |
| 32 | (1) C22 S23 | 72 | (1) C62 S63 |
| 33 | (2) C23 S24 | 73 | (2) C63 S64 |
| 34 | (3) C24 S25 | 74 | (3) C64 S65 |
| 35 | (4) C25 S26 | 75 | (4) C65 S66 |
| 36 | (5) C26 S27 | 76 | (5) C66 S67 |
| 37 | (6) (7) C27 | 77 | (6) C67 C67 |
| 41 | (0) C31 S32 | | |
| 42 | (1) C32 S33 | 82 | C20 S21 |
| 43 | (2) C33 S34 | 83 | C82 S31 |
| 44 | (3) C34 S35 | 84 | C83 S41 |
| 45 | (4) C35 S36 | 85 | C84 S51 |
| 46 | (5) C36 S37 | 86 | C85 S61 |
| 47 | (6) C37 C37 | 87 | C86 S71 |
| 51 | (0) C41 S42 | 91 | C71 S72 C87 |
| 52 | (1) C42 S43 | 92 | C72 S73 C91 |
| 53 | (2) C43 S44 | 93 | C73 S74 C92 |
| 54 | (3) C44 S45 | 94 | C74 S75 C93 |
| 55 | (4) C45 S46 | 95 | C75 S76 C94 |
| 56 | (5) C46 S47 | 96 | C76 S77 C95 |
| 57 | (6) C47 C47 | 97 | C77 (7) C96 |

TABLE 1

Operation of the constant multiplier of FIG. 1 may be more fully understood from the example of FIG. 4. Assume that the input word is "01100101" and that the constant is "11111111". The input word is therefore added to itself seven times, each time being shifted left one additional bit position. On the first line of FIG. 4, the input word "01100101" is written, on the next line the input word shifted left one bit position is written, and on the following line the input word shifted left one additional bit is written. Using the full adders in column 2, a partial product is then formed by adding together the first three lines. Note that addition of the right-most bit of the first line is not required; rather, this bit is output directly as LSB(0). Also, note that addition of the left-most bit on the third line is reserved for the next column of adders, column 3. The results of the addition of column 2 are "10011101" (sum) and "011000010" (carry). The carry result is written shifted one left with respect to the sum result.

The data word, shifted left the appropriate number of times, is then again added, this time in column 3. Operation proceeds in this manner until columns 8 and 9. In a final summation, the least significant bit of the input word is output as the least significant bit of the product, and $S_{20}$ is output as the next significant bit. Adder 82 then adds $S_{21}$ and $C_{20}$. $S_{82}$ is output as the next significant bit of the product, and $C_{82}$ is input to adder 83 to be added with $S_{31}$. Operation proceeds in this manner until adder 91. Adder 91 adds $S_{72}$, $C_{71}$ and $C_{87}$. $S_{91}$ is output as part of the product and $C_{91}$ is input to adder 92 to be added with $S_{73}$ and $C_{72}$, etc. The sum bit and the carry bit, if any, of the final adder (adder 97) are output as part of the product.

In FIG. 5, the same calculation is performed, but the multiplicand and the constant are now assumed to be reversed; i.e., the multiplicand is now "11111111" and the constant is now "01100101". Operation proceeds as in FIG. 4. Note that in lines 2, 6, 9, 11 and 18, however, zero is added to a previous result, unnecessarily so. By eliminating these unnecessary additions, the constant multiplier may be made smaller and faster. Unnecessary additions are eliminated by, using the circuit of FIG. 1 as a prototype, removing corresponding columns of adders. In general, each output signal of each adder deleted is logically connected to a corresponding output signal in a preceding logical column of adders, with the following exceptions. In the case of a first logical column of adders having no preceding logical column of adders, each output signal of each adder deleted is logically connected to a bit of the multiplicand. Also, in the case of the top-most row of adders, each output signal of each adder deleted is logically connected to either the most significant bit of the multiplicand or to logic 0. The resulting circuit and its corresponding operation for constant "01100101" are shown in FIGS. 2 and 6, respectively.

Referring first to FIG. 6, on the first line, the input word is entered in correspondence to the least significant bit of the constant, which is a one. On the next line, if the next significant bit of the constant were a one, the input word would be entered again, shifted one to the left. Since the next significant bit of the constant is a zero, however, a place-keeping zero, shown in phantom outline, is entered. The next significant bit of the constant is a one. The input word, shifted left twice with respect to the input word on the first line, is therefore entered on the second line next to the phantom zero. The next two bits of the constant are zeros. On the third line, two phantom place-keeping zeros are therefore entered. The next bit of the constant is a one. The input word, shifted to the left three times with respect to the input word on the second line, is therefore entered on the third line next to the place-keeping zeros. Bits 0–5 of the constant have then been accounted for, and column 5 of the adders is used to perform the addition. The next bit of the constant is a one and is the final one in the constant. The input word, shifted one to the left with respect to the input word on line 3, is therefore entered on line 6, and the column 6 adders are used to perform the addition. The column 8 and 9 adders are then used to perform the final summation. These columns are output-producing columns and are never removed from the circuit. Comparing FIG. 6 to FIG. 5, the same result is obtained much more compactly using four fewer columns of adders.

Referring to FIG. 2, adder columns 2, 3, 4 and 7 have been removed as compared to FIG. 1. With adder 71 removed, $S_{71}$ is connected to $S_{62}$, and $C_{72}$ is connected to $C_{62}$. With adder 72 removed, $S_{72}$ is connected to $S_{63}$, and $C_{72}$ is connected to $C_{62}$, etc. In terms of FIG. 5, this corresponds to bringing $S_6$ and $C_6$ from lines 16 and 17 down to lines 19 and 20. In the case of adder 77, with $C_6$ moved from line 17 down to line 19, only the most significant bit of the input word, "BIT Z" in FIG. 5, remains to be added by adder 77. $S_{77}$ is therefore connected to $X(7)$. In general, if column y is removed, $S_{y7}$ is connected to $X(7)$ if bit X-1 of the constant is a one and is connected to logic 0 if bit X-7 of the constant is a zero.

In the case of columns 3 and 4, the sum and carry outputs of each adder in rows 1–6 are connected to the sum and carry outputs of the adder in the next higher row in the preceding column. For example, $S_{41}$ is connected to $S_{32}$, which is in turn connected to $S_{23}$. In the case of adder 47, since bit 3 of the constant is zero, $S_{47}$ remains unconnected, or is connected to logic 0. In the case of adder 37, bit 2 of the constant is one. $S_{37}$ is therefore connected to $X(7)$.

Note that in circled regions A, A' and A", the connections of adders 37, 47 and 97 to $X(7)$ have been disconnected. In general, when a column is removed, the next row 7 adder connected to $X(7)$ is disconnected from $X(7)$. Also, at points B, B' and B", the inputs to the column 8 adders that in FIG. 1 are grounded, or tied to logic zero, are connected instead to the carry output of the first adder in the preceding column for each of columns 3–7 that is removed. That is, in FIG. 2, columns 3, 4 and 7 have been removed. Corresponding ones of the inputs tied to ground in FIG. 1 are therefore connected instead to $C_{21}$, $C_{31}$ and $C_{61}$, respectively.

Connection of the outputs of the adders of columns 3, 4 and 7 as previously described is relatively straight-forward. Connection of the outputs of the adders in column 2 is somewhat more involved. Connection depends on the value of the shortest, least-significant portion of the constant that contains three ones. In the present example, the shortest least-significant portion of the constant that contains three ones is "100101". The shortest possible least significant portion of the constant that could contain three ones is, of course, "111". In the latter case, the column 2 adders are not removed but remain in the circuit. In all other cases, the column 2 adders are removed. Connection of the outputs of the column 2 adders then depends particularly on the number ($N_1$) of intervening zeros between the first logic 1 in the constant and the next logic 1 in the constant, as well as the number ($N_2$) of intervening zeros between the second logic 1 in the constant and the next logic 1 in the constant. The sum $N_1+N_2+2$ indicates the first column of adders to remain in the circuit.

The method of determining connections of the sum and carry outputs of column 2 may best be appreciated from a concrete example. Assume, for example, that the constant is "01010101". Therefore, $N_1=N_2=1$, and $N_1+N_2+2=4$, indicating that column 4 will be the first adder column to remain in the circuit. The multiplication may be performed as illustrated in FIG. 7.

Referring to FIG. 8, the inputs to column 4 adders are listed on the left-hand side of the figure. The inputs to the adders listed in the left-most column of FIG. 8 always proceed in the sequence (0), (1), ..., (6). The inputs in the next column are determined by the distance $N_2$. If $N_2$ were zero, the inputs in the second column would all be one greater than the inputs in the first column. Since $N_2=1$, however, the inputs in the second column are all two greater than the inputs in the first column. Similarly, the distance $N_1$ determines the relationship between the inputs in the third column and those in the second column.

Based on the inputs to the column 4 adders shown on the left-hand side of FIG. 8, the connections of the sum and carry outputs of column 2, listed on the right-hand side of the figure, may be determined. In order to provide the input (2) to adder 41, $C_{31}$ must be connect to (2). $C_{31}$ is connected in turn, however, to $C_{22}$, requiring that $C_{22}$ be connected to the (2). In this manner, each of the carry signals $C_{20}$, $C_{21}$, ..., $C_{27}$ is determined in ordered sequence.

For J=3 to 7 and K=1 to 6, each of the adders JK receives as an input signal a carry output signal from an adder in the same row in the previous column. With respect to the S outputs, however, each of the adders receives as an input signal the sum output signal from a next higher row in the previous column. In order to provide (4) to adder 41, the sum output signal $S_{32}$ must therefore be connected to (4). $S_{32}$ is connected in turn, however, to $S_{23}$. In this manner, connections of each of $S_{20}$, $S_{21}$, ..., $S_{27}$ may be determined in ordered sequence.

Having determined the connections of the sum and carry outputs of column 2, the circuit of FIG. 1 may be modified in accordance with the rules developed above. Since $N_1+N_2+2=4$, column 4 will be the first column of adders to remain in the circuit. Columns 2 and 3, therefore, are removed. Column 5 is removed, since bit 5 of the constant is zero, and column 7 is removed since bit 7 of the constant is also zero. For each of the adders in rows 1–6 in columns 3, 5 and 7, the sum and carry output signals are connected to the sum and carry output signals of a next higher row in the previous column. Hence $S_{71}$ is connected to $S_{62}$, $C_{71}$ is connected to $C_{62}$, etc. In the case of adders 37, 57 and 77, the sum bit is connected to $X(7)$, and the connections of $X(7)$ to adders 41, 61 and 91 are broken in regions A, A' and A", respectively. In regions B, B' and B", the inputs to the column 8 adders are connected to the carry output of the first adder in the preceding column. Finally, the sum and carry outputs of the column 2 adders are connected as determined in relation to FIG. 8.

The rules developed above are written into a knowledge base of the constant multiplier compiler. The compiler is designed to run on an engineering workstation, for example a 33 MIPS super-mini computer. After the designer has specified the desired constant, the constant multiplier compiler determines connections of the various adders to arrive at a final netlist.

Once the proper connections have been made and the final netlist has been determined, the netlist may be input to a physical design tool for actual layout of the physical circuit. During layout of the physical circuit, the extra space that would have been occupied by the adders that were removed from the circuit is compacted out of the final design. Size of the circuit is therefore decreased and speed of the circuit is increased.

The foregoing has described the principles, preferred embodiments, and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of the present invention as defined by the following claims.

What is claimed is:

1. An unsigned constant multiplier circuit for computing a product of a multi-bit multiplicand and a multi-bit constant that uses full adders each having three input terminals and two output terminals, a sum output terminal and a carry output terminal, the circuit comprising:

an interconnected array of full adders logically arranged in rows and columns, full adders in an input column each receiving different ones of said bits of said multi-bit multiplicand, full adders in each of two output columns each producing a product bit, each column besides said output columns producing a partial product, with each full adder in each row in columns besides said output columns receiving a same one of said bits of said multi-bit multiplicand;

wherein a number of columns is less than said number of bits of said multiplicand, said array of full adders being interconnected such that partial products corresponding to zeros in said multi-bit constant are not produced.

* * * * *